(12) United States Patent
Kim

(10) Patent No.: US 6,930,952 B2
(45) Date of Patent: Aug. 16, 2005

(54) METHOD OF READING MEMORY DEVICE IN PAGE MODE AND ROW DECODER CONTROL CIRCUIT USING THE SAME

(75) Inventor: Sung Ryong Kim, Ichon-Shi (KR)

(73) Assignee: Hynix Semiconductor, Inc., Kyungki-Do (KR)

( * ) Notice: Subject to any disclaimer, the term of this patent is extended or adjusted under 35 U.S.C. 154(b) by 48 days.

(21) Appl. No.: 10/740,101

(22) Filed: Dec. 18, 2003

(65) Prior Publication Data

US 2004/0240303 A1 Dec. 2, 2004

(30) Foreign Application Priority Data

May 30, 2003 (KR) ................................ 10-2003-0034892

(51) Int. Cl.[7] ................................................. G11C 8/00
(52) U.S. Cl. ............................ 365/230.06; 365/189.08; 365/194; 365/238.5
(58) Field of Search .......................... 365/230.06, 203, 365/238.5, 239, 189.08

(56) References Cited

U.S. PATENT DOCUMENTS

| | | | | |
|---|---|---|---|---|
| 5,640,363 A | * | 6/1997 | Furutani et al. | 365/233.5 |
| 5,642,326 A | * | 6/1997 | Sakurai et al. | 365/230.06 |
| 5,745,428 A | * | 4/1998 | Rao | 365/230.03 |

* cited by examiner

Primary Examiner—Son T. Dinh
(74) Attorney, Agent, or Firm—Marshall, Gerstein & Borun LLP

(57) ABSTRACT

The Disclosed is a method of reading a memory device in a page mode. The method includes the steps of inputting a row address for selecting the word line, enabling a corresponding word line by the row address, and reading/restoring the level of the cell node connected to the enabled word line, and disabling the enabled word line and sequentially enabling bit line sense amplifiers connected to the disabled word line to perform a read operation, wherein the disabling of the selected word line is performed after a lapse of a certain time period as much as data of a first cell node can be restored. Therefore, it is possible to reduce current consumption in a read operation of a page mode.

7 Claims, 11 Drawing Sheets

METHOD OF READING MEMORY DEVICE
IN PAGE MODE AND ROW DECODER
CONTROL CIRCUIT USING THE SAME

BACKGROUND

1. Field of the Invention

The present invention relates to a method of reading a memory device in a page mode and a row decoder control circuit using the same, and more particularly, to a method of reading a memory device in a page mode wherein word lines are enabled by application of a row address and the word lines are disabled after a lapse of a certain time period as much as data of the first cell node is restored, and a row decoder control circuit using the same.

2. Discussion of Related Art

A page mode is one capable of eliminating a row address delay when access is made to the same rows. A set of bit cells within a single row is referred to as a page of the data.

A conventional method of reading a memory device in the page mode will now be described.

FIG. 1 is a circuit diagram illustrating a conventional structure in which a DRAM cell and a bit line sense amplifier are interconnected. NMOS transistors N1, N2:10 having gates each applied with a BISH signal serve as a switching for connecting to upper side cells. A sense amplifier 20 includes PMOS transistors P1, P2 for pulling up a bit line BL to a HIGH level and NMOS transistors N3, N4 for pulling down the bit line BL to a LOW level. Meanwhile, a bit line equalizing circuit 30 includes NMOS transistors N7, N8 and N9 for initializing the bit line BL and each node of a bit line sense amplifier BLSA using a bit line precharge signal (BLP). NMOS transistors N5, N6 function to transmit the data of the bit line BL to a line LDB by applying a column address (YI). Further, a signal for driving the bit line sense amplifier is applied through lines RTO, SB.

FIG. 2 is a timing diagram illustrating an operating waveform of the DRAM cell and the bit line sense amplifier according to the prior art. Referring to FIG. 2, at the initial state, while the bit line BL is initialized by bit line precharge voltages (VBLP, Vcore/2) in a period (1), the voltages of the cell node CN and the bit line BL are then charge-shared after the word line WL is enabled in a period (2). If the bit line sense amplifier is then enabled after a sufficient time period, the bit line BL is amplified by still higher voltage in a period (3). The signal amplified thus is connected to the local data bus LDB by the column decoder signal (yi) in a period (4). At this time, a local data bus LDB that has been precharged is gradually dropped to a lower voltage by the bit line sense amplifier. In a period (5), the column decoder signal (Yi) is disabled. After a given period of time elapsed, the voltage of the cell node CN is sufficiently restored. In a period (6), the word line WL is disabled. After a lapse of a certain time period, the bit line sense amplifier is disabled. Each of the nodes of the bit line and the bit line sense amplifier is initialized to become a state like the (1) period.

From the above operation, it could be known that the word line WL must be always disabled after the cell node CN is restored as much as a given voltage (Vcore) level, for a stable operation. This is a problem occurring due to the fact that the cell has to be restored again if the read operation is once performed with characteristics of the DRAM cell. In other words, if the word line is once enabled, the word line needs to be disabled after a previous data is again written into the cell.

Meanwhile, in the memory device of the page mode, the data is read while changing only the column address after the word line is enabled. As shown in FIG. 2, the data is read while a column decode signal (Yi) is continuously toggled in a state where the word line is enabled.

FIG. 3 shows a waveform of a word line control signal in the read operation of the page mode according to the prior art. AN indicates an external address, AP a page address, AX an internal address outputted through the address buffer, BAX(0) a signal outputted from the row decoder in order to drive an $0^{th}$ word line, and WL0 a signal applied to the $0^{th}$ word line. Time ((1) in FIG. 3) for disabling a new external address (AN) when it is inputted is always required. FIG. 4 shows a waveform of the word line control signals where the external address is inputted due to the interrupt when the read operation is performed in the page mode. That is, it shows a case where a new external address (AN) is inputted at an early stage. Once the external address (AN) is changed, the column decoder signal (Yi) is disabled to cancel the operation of reading the data in the bit line sense amplifier. For a certain time period, time for the cell node CN to perform the restore operation is needed. The operation can be performed for an external address that has been newly changed after the word line was disabled.

Therefore, in the read operation of the page mode that had been executed before the new external address (AN) was inputted, it is required that the word line WL(0) be disabled and a next word line WL1 be enabled, after the restore operation is executed until the voltage of the cell node CN reaches a stable state by the voltage applied to the bit line. As shown in FIG. 4, therefore, in order to enable a word line corresponding to an input address (AN) that is newly inputted, as much time as ((3) in FIG. 4) is more required. In other words, in order to enable the word line corresponding to the input address (AN) that is newly inputted, as much time as (1)+(2)+(3) is required.

While the voltage applied to the bit line is varied, the cell node CN is changed along the bit line. This is applied to all the cases where a LOW-level voltage or a HIGH-level voltage is stored at the cell node. For this reason, the word line structure in which the word line must be continuously enabled until the external address is changed, has problems that it causes the entire access time to be delayed and increases current consumption.

SUMMARY OF THE INVENTION

The present invention is contrived to solve the aforementioned problems. The present invention is directed to provide a method and a circuit capable of reducing current consumption in a page mode.

According to a preferred embodiment of the present invention, there is provided a method of reading a memory device in a page mode, which is able to reduce the entire access time and permits a more stable operation.

One aspect of the present invention is to provide a method of reading a memory device in a page mode wherein a single word line is enabled to sense levels of a plurality of cell nodes connected thereto, including the steps of inputting a row address for selecting the word line, enabling a corresponding word line by the row address, and reading/restoring the level of the cell node connected to the enabled word line, and disabling the enabled word line and sequentially enabling bit line sense amplifiers connected to the disabled word line to perform a read operation, wherein the disabling of the selected word line is performed after a lapse of a certain time period as much as data of a first cell node can be restored.

Preferably, the disabling of the selected word line may be performed using a precharge control signal (pcg). The precharge control signal (pcg) may be generated, by using a given delay sense signal to generate a pulse. The precharge control signal (pcg) may be generated, by performing a NAND operation for the given delay sense signal and an address transition detector signal generated by a page address.

According to another aspect of the present invention, there is provided a row decoder control circuit for controlling a row decoder that is controlled by an internal address, a row active signal and a precharge control signal, in a page mode wherein a single word line is enabled to sense levels of a plurality of cell nodes connected thereto, including a pulse output unit for outputting a given delay sense signal inputted thereto as a pulse and then inputting the pulse as the precharge control signal, wherein after the word line is enabled by a row address, the precharge control signal is outputted after a lapse of a certain time period as much as the data of a first cell node can be restored, and the enabled word line is then disabled in response to the outputted precharge control signal.

According to still another aspect of the present invention, there is provided a row decoder control circuit for controlling a row decoder that is controlled by an internal address, a row active signal and a precharge control signal, in a page mode wherein a single word line is enabled to sense levels of a plurality of cell nodes connected thereto, including a pulse output unit for performing a NAND operation for a given delay sense signal and an address transition detector signal of a page address to output the signals as pulses, and inputting the pulses as a precharge control signal, wherein the address transition detector signal is generated by a page address for reading at least second cell node within the same row address, and the enable word line is disabled in response to the output precharge control signal.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF PREFERRED EMBODIMENTS

The present invention will now be described in detail in connection with preferred embodiments with reference to the accompanying drawings.

Figure 5:
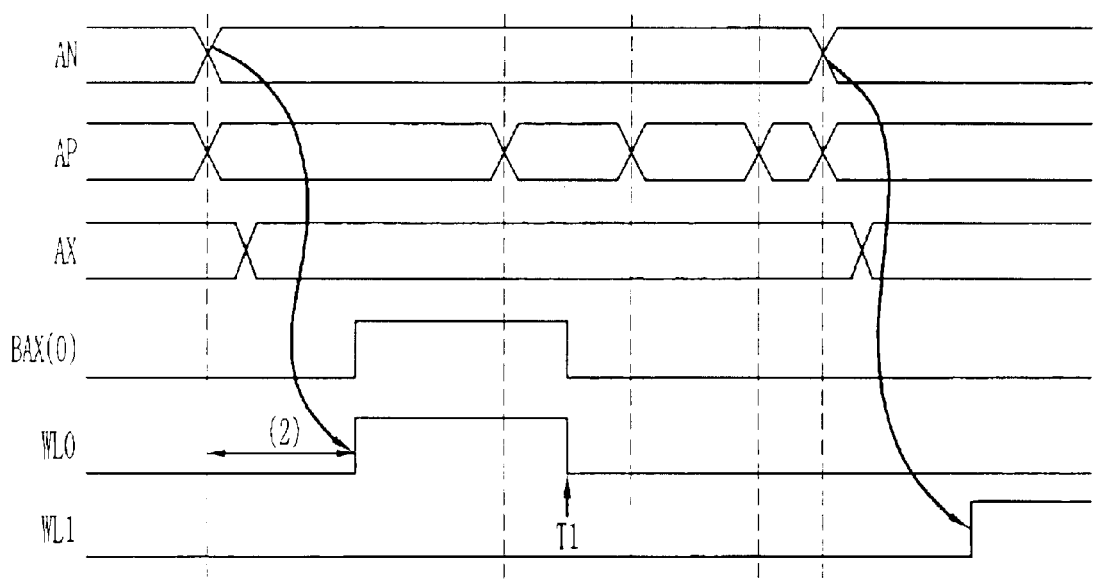
FIG. 5 shows a waveform of word line control signals in a read operation of a page mode according to the present invention.
Figure 6:
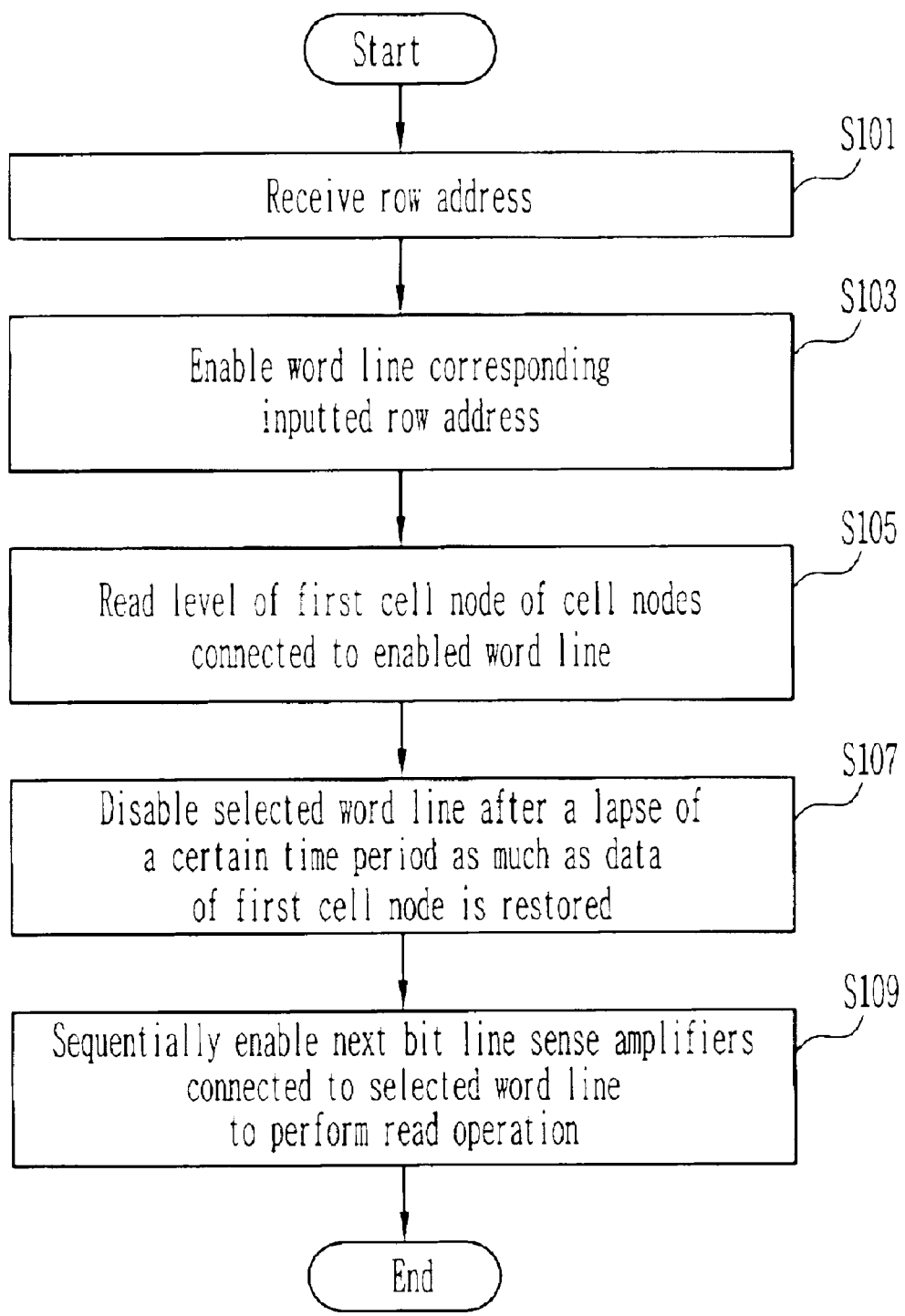
FIG. 6 is a flowchart illustrating a read method in a page mode according to the present invention.

A read method in a page mode will now be described in detail with reference to FIGS. 5 and 6, wherein FIG. 5 is a waveform of word line control signals in the read operation of the page mode according to the present invention and FIG. 6 is a flowchart illustrating the read method in the page mode according to the present invention.

The present invention differs from the prior art in that the read operation in the page mode is executed through the external row address (AN) and the page address (AP) inputted, wherein a corresponding word line is disabled after the first cell of a corresponding row address is read and restored. In this case, since the bit line sense amplifiers connected to corresponding word lines are enabled and all the data are completely sensed, it does not need to continue to turn on the word lines. Thus, it may well enable only the bit line sense amplifiers. In FIG. 5, there is shown the waveform of the word line control signals for performing the read operation in the page mode according to the present invention.

Referring to FIG. 5, time ((2) in FIG. 5) where the word line WL0 selected by application of the external row address (AN) is enabled is required. Next, after a certain time period as much as the first cell node is read and the data is to be restored due to application of the page address (AP) of the page mode, the word line WL0 selected, i.e., at T1 is disabled. Further, the read operation is then continuously performed from a next cell node by change in the page address (AP).

In other words, after the first cell is read to the input of the row address in the page mode, all the data have already been completely sensed since the bit line sense amplifier is already enabled. Since there is no need to continue to turn on the word line, therefore, it may well enable only the bit line sense amplifier. In this manner, if the word line is turned off and the bit line and a decoding path are precharged, it is possible to shorten the precharge time in a next cycle and advance the access time.

Figure 1:
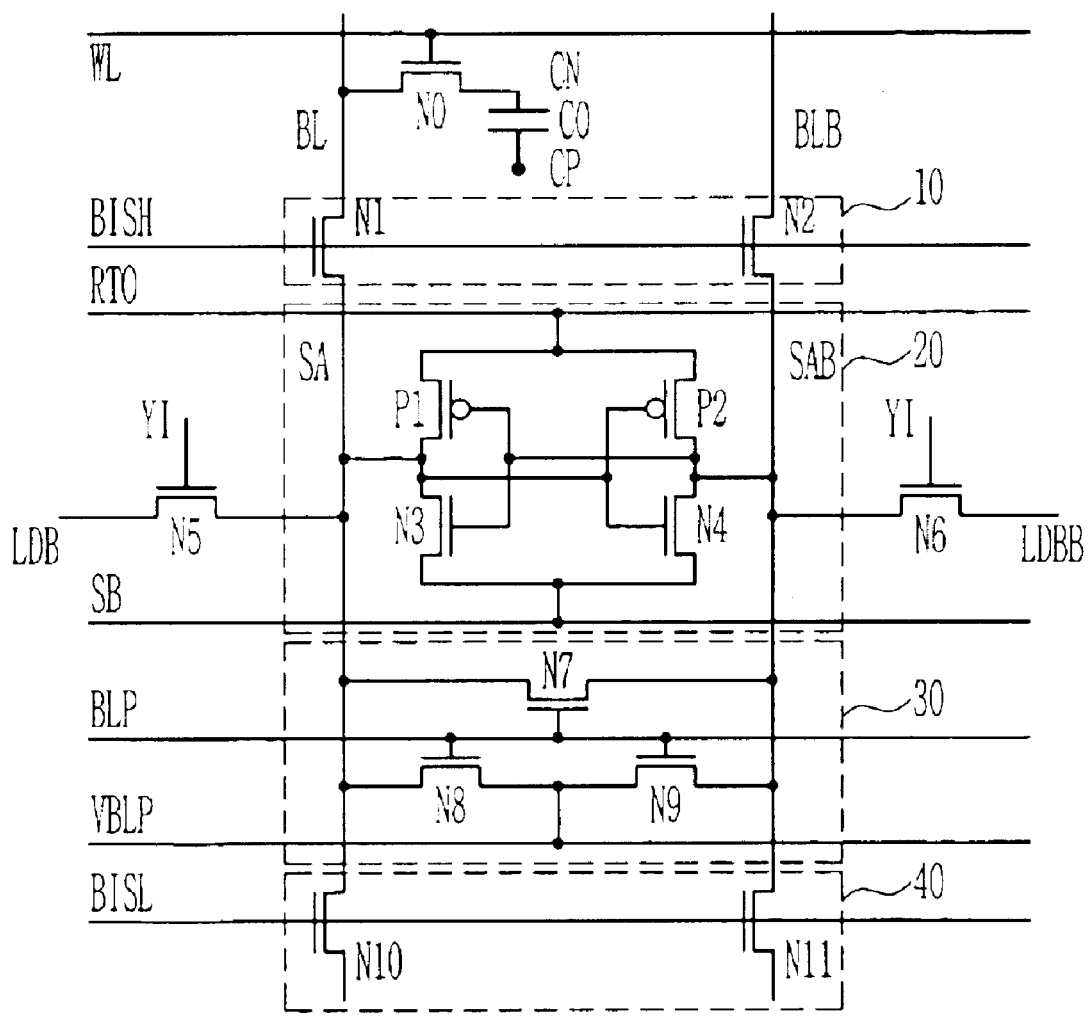
FIG. 1 is a circuit diagram illustrating a conventional structure in which DRAM cells and bit line sense amplifiers are interconnected.
Figure 2:
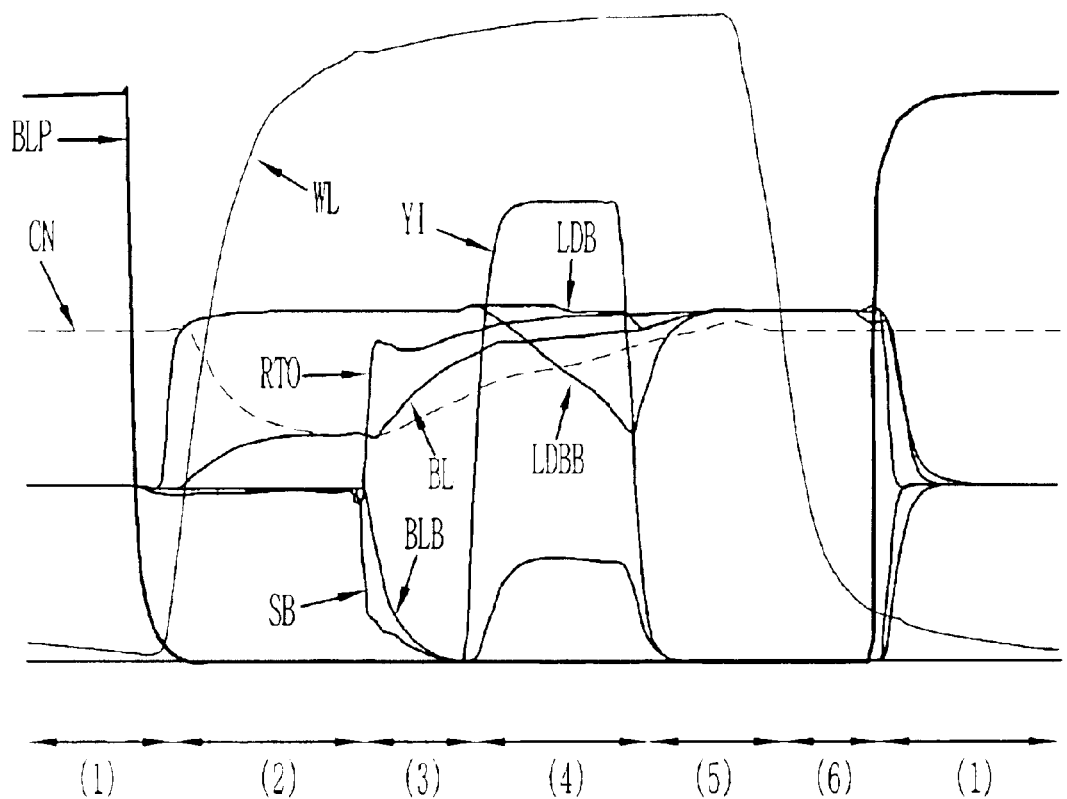
FIG. 2 is a timing diagram illustrating an operating waveform of the DRAM cell and the bit line sense amplifier according to the prior art.
Figure 3:
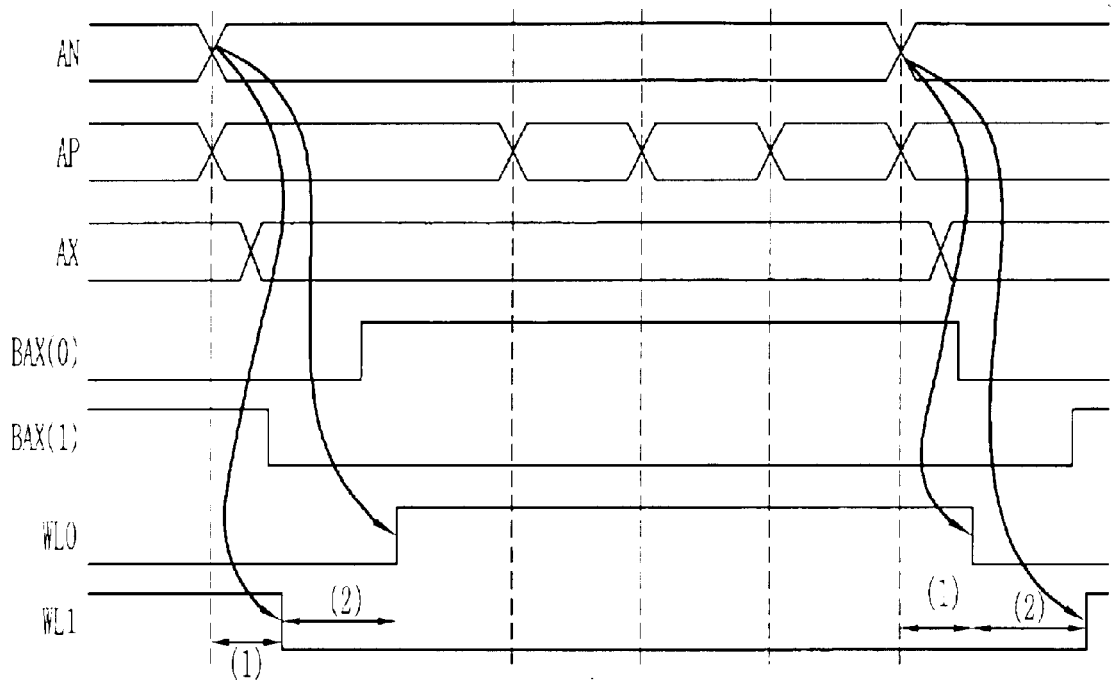
FIGS. 3 and 4 show waveforms of word line control signals in a read operation of a page mode according to the prior art.
Figure 4:
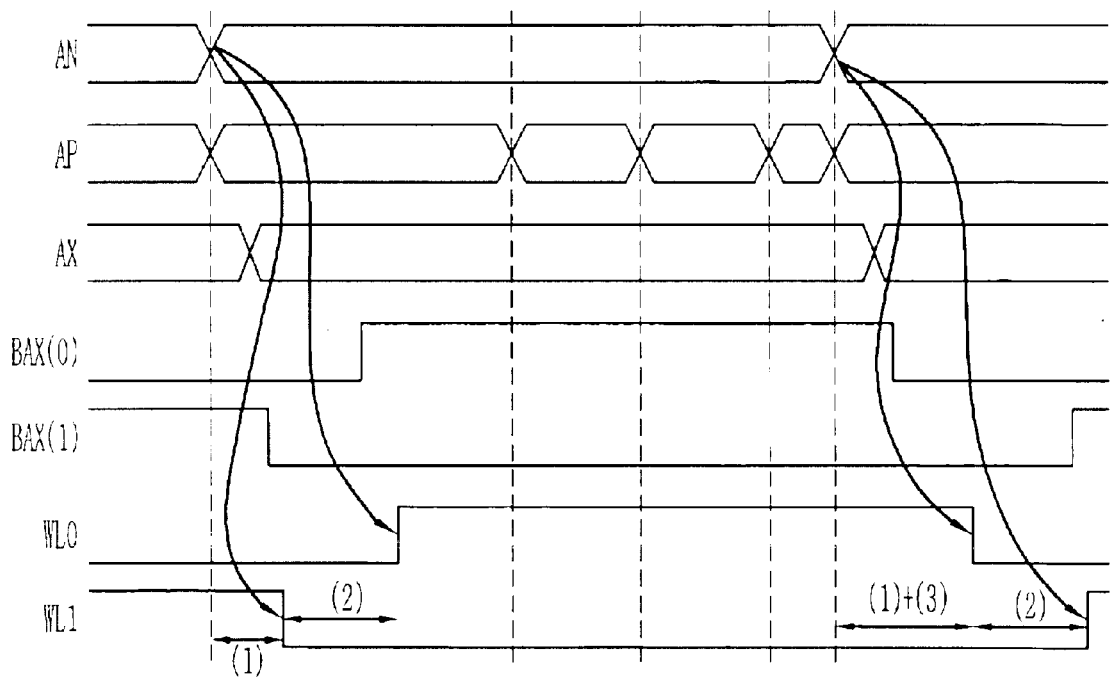

Furthermore, if the word line is previously disabled, it is possible to reduce as much time as (1) in FIG. 3 being a time period where the previous word line must be disabled. As a result, the entire access time can be reduced and a more stable operation can be realized.

FIG. 6 is a flowchart illustrating the method of reading the memory device in the page mode according to the present invention.

In the page mode where word lines are enabled to sense the levels of a plurality of cell nodes connected thereto, a row address for selecting the word lines is inputted (S101). A word line corresponding to the inputted row address is enabled (S103). In the page mode, the cell nodes connected to the selected word lines are sequentially read. Therefore, the level of the first cell node of the connected cell nodes is read (S105). Next, after a lapse of a certain time period as much as data of the first cell node is restored, the selected word line is disabled (S107). In order to read a next cell node connected to the selected word line, next bit line sense amplifiers are sequentially enabled to execute the read operation (S109).

(First Embodiment)

According to the first embodiment, after a lapse of a certain time period as much as the operation of the bit line sense amplifier is stably performed and the data of the first cell node CN is sufficiently restored, a delay circuit is used in order to disable the word lines. In other words, the delay time is adjusted by stably executing the operation of the first bit line sense amplifier in design and calculating as much time as the data of the cell node is sufficiently restored.

Preferably, the circuit is constructed to output a sense delay signal (sensedly) and to generate a precharge control signal (pcg) based on the output. The circuit can also be implemented so that the word line enabled by the precharge control signal (pcg) is disabled. Accordingly, the circuit can be implemented by outputting the precharge control signal (pcg) after a lapse of an adequate time period as much as the data of the first cell is read and restored thorough control of the delay time, after the sense delay signal (sensedly) is outputted.

Figure 7:
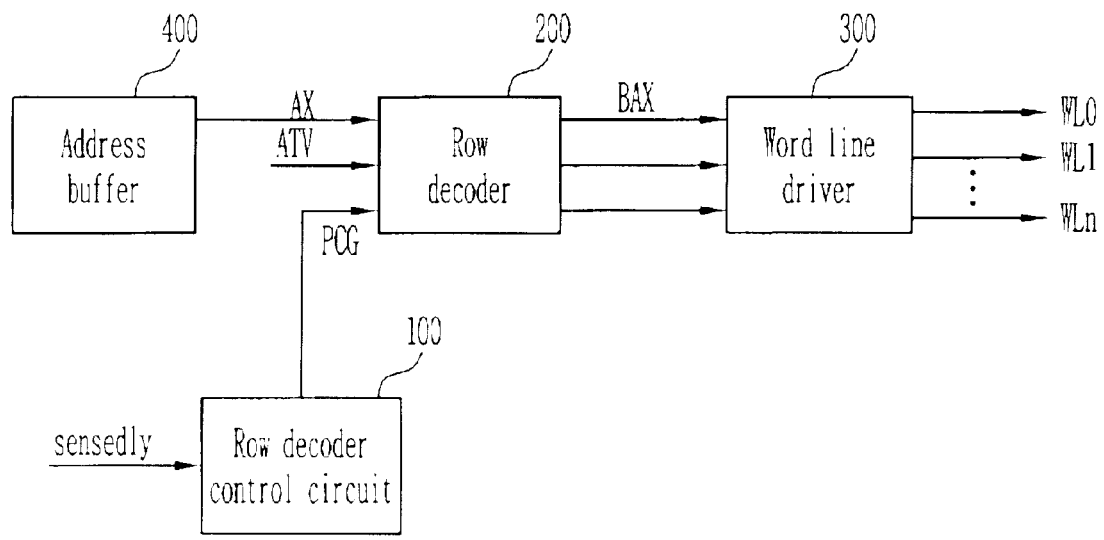
FIG. 7 is a block diagram illustrating a circuit having a row decoder control circuit according to a first embodiment of the present invention.
Figure 8:
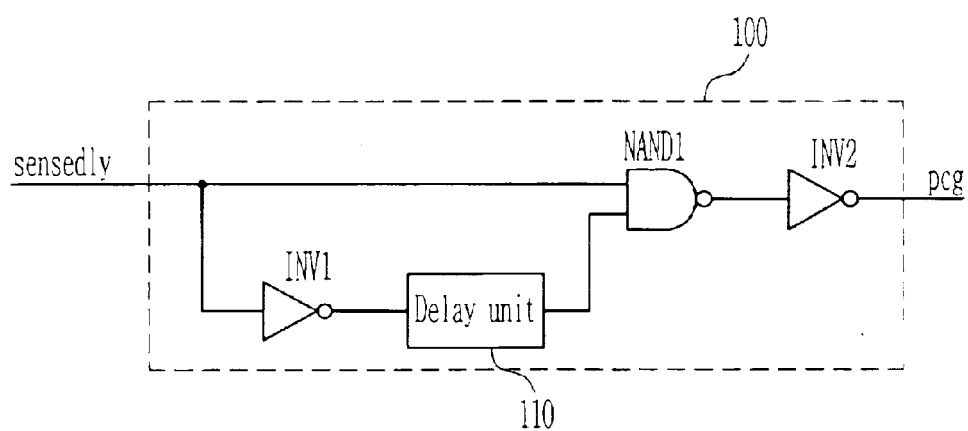
FIGS. 8 to 10 are detailed circuit diagrams each illustrating the row decoder control circuit, the row decoder and the word line driver circuit according to the first embodiment of the present invention.
Figure 9:
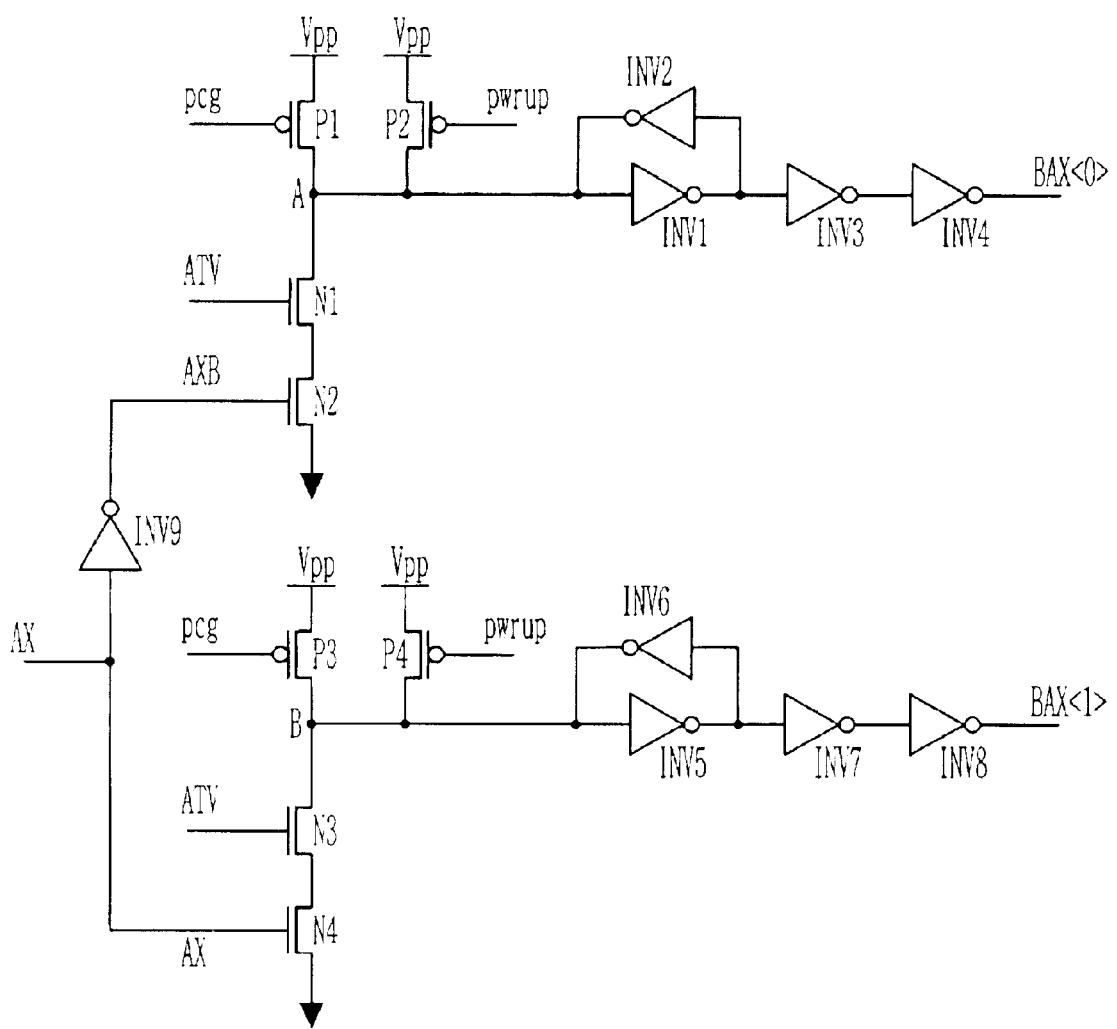
Figure 10:
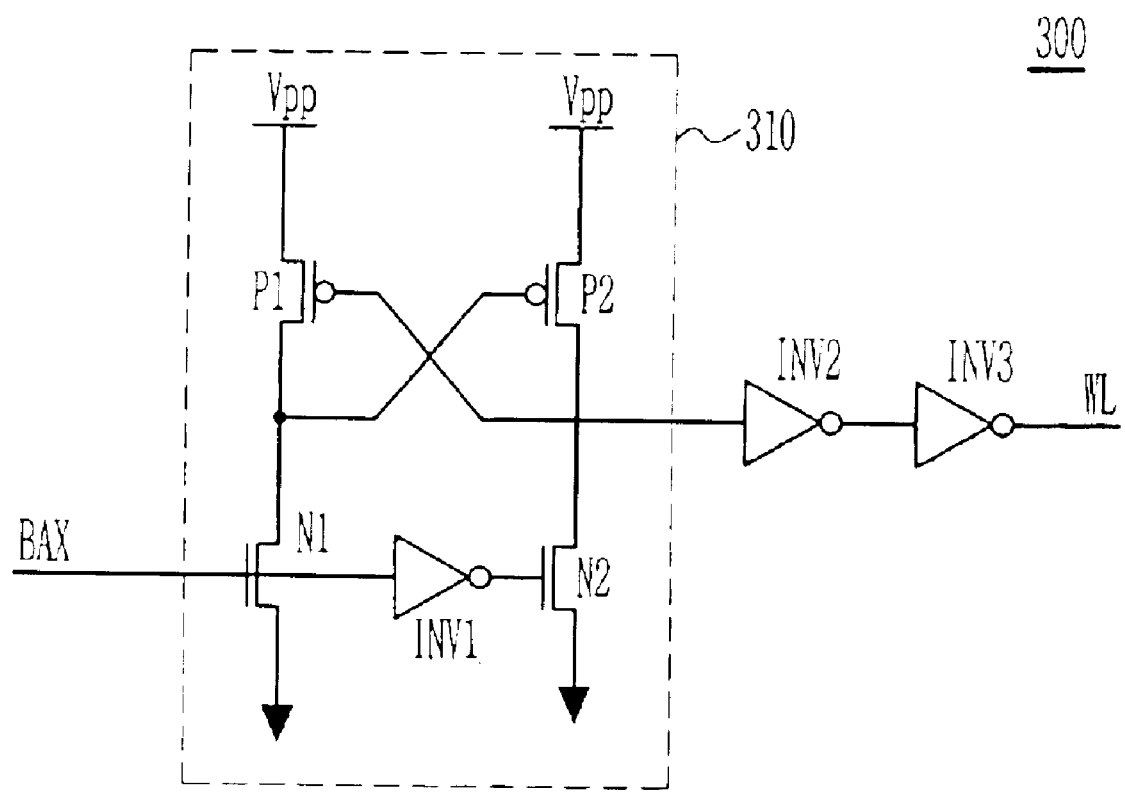

FIG. 7 is a block diagram illustrating a circuit having a row decoder control circuit 100 according to a first embodiment of the present invention. FIGS. 8 to 10 are detailed circuit diagrams each illustrating a row decoder control circuit 100, a row decoder 200 and a word line driver circuit 300 according to the first embodiment of the present invention.

Referring to FIG. 7, an external address (AN) of a TTL signal inputted from the outside through an address buffer 400 is converted into an internal address of a CMOS signal. A part of the converted signal is outputted as a pulse signal through an address transition detector (ATD) circuit and the remaining internal address signal (AX) is inputted to the row address decoder 200 via a latch. The row decoder control circuit 100 receives a sense delay signal (sensedly) that is activated through a delay circuit and then outputs a precharge signal (pcg). For example, the sense delay signal (sensedly) that is delayed by a certain time from application of the row active signal (ATV) may be used. The sense delay signal (sensedly) can prevent the data of the DRAM cell from being lost when the page address is inputted too early in order for the DRAM cell to secure the minimum restore time. The row address decoder 200 decodes the address signal (AX) outputted from the address buffer 400, the row active signal (ATV) and the precharge control signal (PCG) to output a word line control signal (BAX) to the word line. The word line driver circuit 300 receives the word line control signal (BAX) from the row address decoder 200 to drive a selected word line.

By reference to FIG. 8, the present invention differs from the prior art in that it has a row decoder control circuit 100 capable of disabling the word line after the word line is activated in the page mode and data of the first cell node is read. The row decoder control means 100 includes an NAND device NAND1 for performing a NAND operation for the sense delay signal (sensedly) and a signal that is inverted through an inverter INV1 and is then delayed by some time through a delay unit 110, and an inverter INV2 for inverting the signal from the NAND device NAND1 to output the precharge control signal (pcg). At this time, the delay unit 110 can control the delay time so that time as much as the data of the first cell node can be read and restored in the page mode elapses.

With reference to FIG. 9, the row decoder 200 outputs the word line control signal (BAX), using the internal address signal (AX) outputted from the address buffer 400, the row active signal (ATV) and the precharge control signal (pcg) outputted from the row decoder control circuit 100 as inputs. The row decoder 200 includes pull-up means P1, P2 for pulling up a node A, which are driven by the precharge control signal (pcg) and the power application signal (pwrup), and pull-down means N1, N2 for pulling down the node A using an inverse address signal (AXB) and the row active signal (ATV). The node A is connected to an output (BAX(0)) via latches INV1, INV2 and inverters INV3, INV4 for buffering. A circuit configuration connected to an output (BAX(1)) is same as the above except that the address signal (AX) not the address signal inverse signal (AXB) is used in pull-down means N3, N4. For clarity of the description, detailed explanation thereof will be omitted.

FIG. 10 shows a part of the word line driver circuit 300 having a level shifter 310 and buffering means INV2, INV3. Though the real word line driver circuit is divided into several blocks, portions that are divided into the blocks are omitted in FIG. 8 for simplicity of drawing. A voltage of the word line control signal (BAX) is boosted through the level shifter 310.

Figure 11:
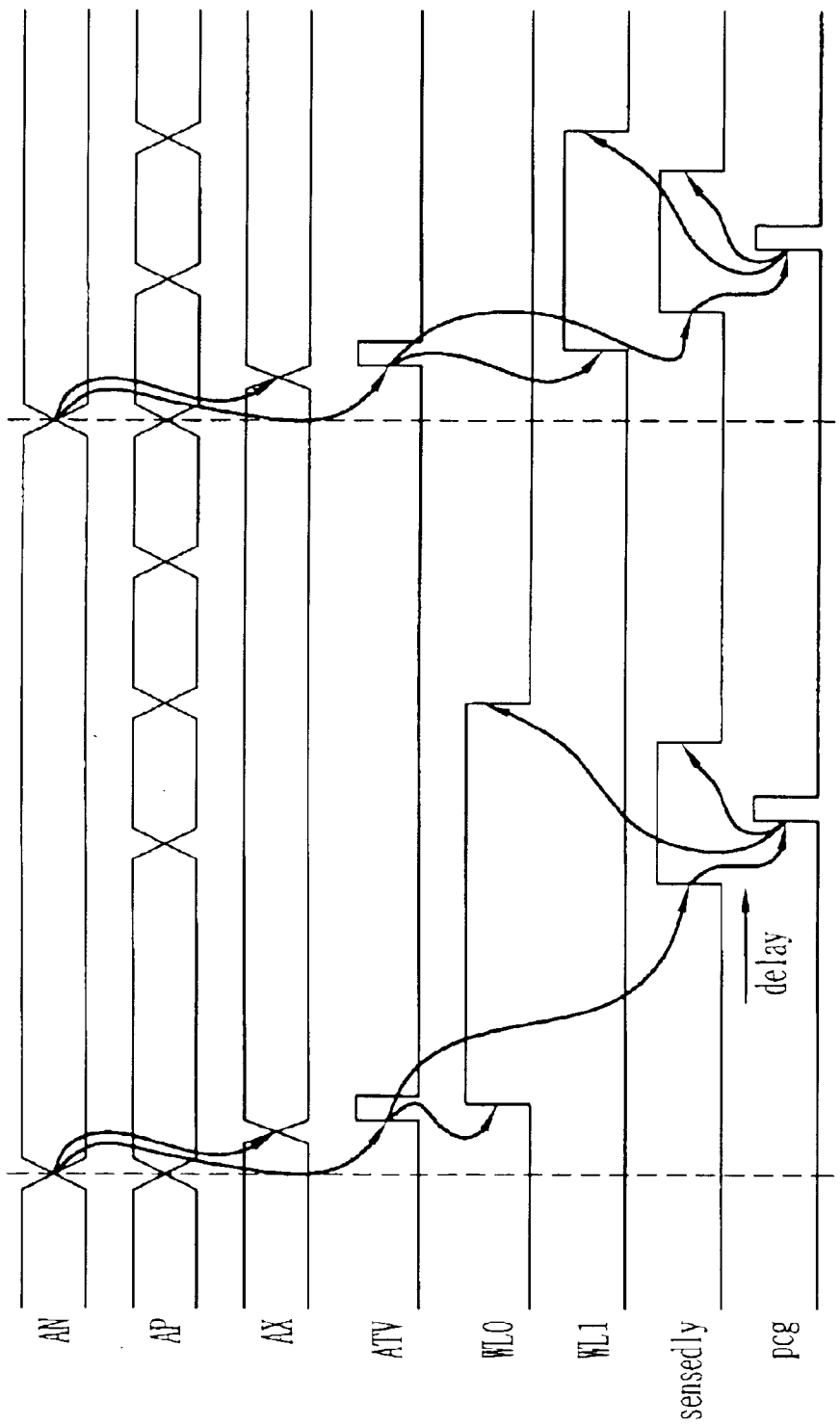
FIG. 11 shows a control waveform of the circuit according to the first embodiment of the present invention.

The operations of the row decoder control circuit, the row decoder and the word line driver circuit will now be described in detail with reference to FIGS. 8 to 11. FIG. 11 shows a control waveform of the circuit according to the first embodiment of the present invention.

If the external address (AN) inputted to the address buffer 400 is changed, the internal address signal (AX) is changed/outputted, and the row active signal (ATV) is generated as a pulse. The row active signal (ATV) is a signal to activate a row path. At this time, the precharge signal (pcg) maintains a LOW level. Referring to the row decoder 200 in FIG. 9, therefore, at the initial stage, if the outputs (BAX(0), BAX(1)) are at a LOW level and the precharge control signal (pcg) is at LOW level, the node A keeps a HIGH level. If the row active signal (ATV) becomes a HIGH level, however, a level (LOW or HIGH) of each of the word line control signals (BAX(0), BAX 1)), being respective outputs, is decided depending on the level of the address signal (AX). In other words, in the case where the address signal (AX) is applied as a LOW level, if the row active signal (ATV) being a pulse of a HIGH level is applied, the word line control signal (BAX(0)) becomes the HIGH state and the word line control signal (BAX(1)) becomes the LOW state. Even if the row active signal (ATV) is changed to the LOW level, the HIGH level of the word line control signal (BAX(0)) remains through the latches INV1, INV2 and the inverters INV3, INV4.

Meanwhile, if the row active signal (ATV) is activated, the sense delay signal (sensedly) that is delayed from the row active signal (ATV) by some time and is then activated, is generated. The sense delay signal (sensedly) may include a sense delay signal that is used at the time of the precharge, for example, in the self-refresh operation of the DRAM. However, the sense delay signal (sensedly) is not restricted to it, however, it may include all the signals that are generated by LOW active and delayed by some time. Referring to FIG. 8, if the sense delay signal (sensedly) is inputted, the row decoder control circuit 100 uses the signal to generate a pulse. In the concrete, the row decoder control circuit 100 performs a NAND operation, using the sense delay signal (sensedly) and the signal that is inverted via the inverter INV1 and is then delayed by some time through the delay unit 110 as two inputs to the NAND device NAND1, thus generating the precharge control signal (pcg). Further, if the precharge control signal (pcg) is generated, a PMOS transistor P1 in FIG. 9 is turned off to prevent the power supply voltage (Vpp) from being applied to the node A, thus disabling the word line WL0. The sense delay signal (sensedly) is also delayed by the precharge control signal (pcg).

As such, the read operation in the page mode according to the embodiment of the present invention can be performed, by controlling the delay time to disable the word line control signal (BAX(0)) so that adequate time as much as the data of the first cell node can be read and restored elapses.

(Second Embodiment)

Figure 12:
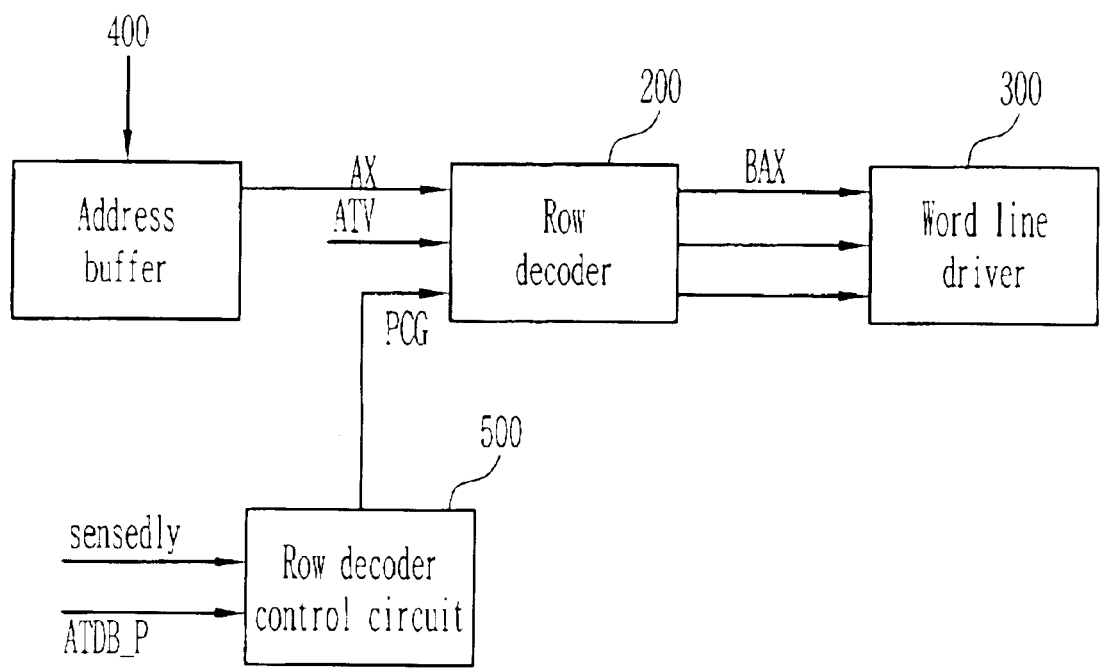
FIG. 12 is a block diagram illustrating the whole circuit having a row decoder control circuit according to a second embodiment of the present invention.
Figure 13:
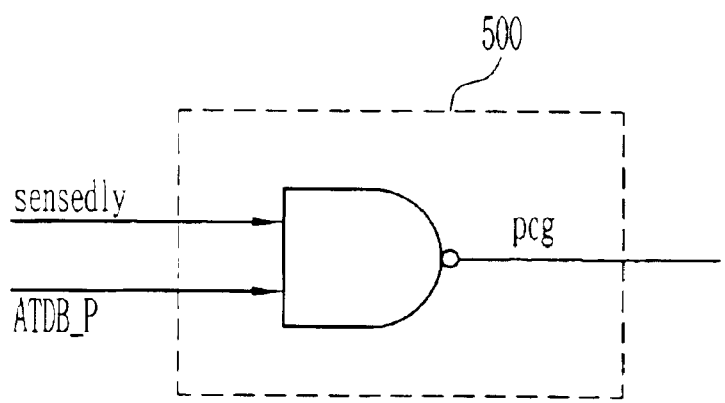
FIG. 13 is a detailed circuit diagram illustrating the row decoder control circuit according to the second embodiment of the present invention.

FIG. 12 is a block diagram illustrating the whole circuit having a row decoder control circuit 500 according to a second embodiment of the present invention. FIG. 13 is a detailed circuit diagram illustrating the control circuit 500 according to the second embodiment of the present invention. Description will now be given on the basis of the difference of the second embodiment from the first embodiment. A row decoder control circuit 500 produces a precharge control signal (pcg) using an address transition detector signal (ATDB_P) generated through a page address (AP). Through this, the circuit is constructed so that the operation of the bit line sense amplifier is stably performed and the word line is disabled after a lapse of a certain time period as much as the data of the first cell node CN will be sufficiently restored. In other words, after the operation for reading the first cell node is finished, the circuit uses the address transition detector signal (ATDB_P) that detects variation in the page address for reading a next cell node to generate the precharge control signal (pcg).

For simplicity of the description, explanation will be given on the basis of the row decoder control circuit 500 that is different from that of the first embodiment. The row decoder control circuit 500 in FIG. 13 includes a NAND device NAND1 for performing a NAND operation for the sense delay signal (sensedly) and the address transition detector signal (ATDB_P) and outputs the precharge control signal (pcg).

Figure 14:
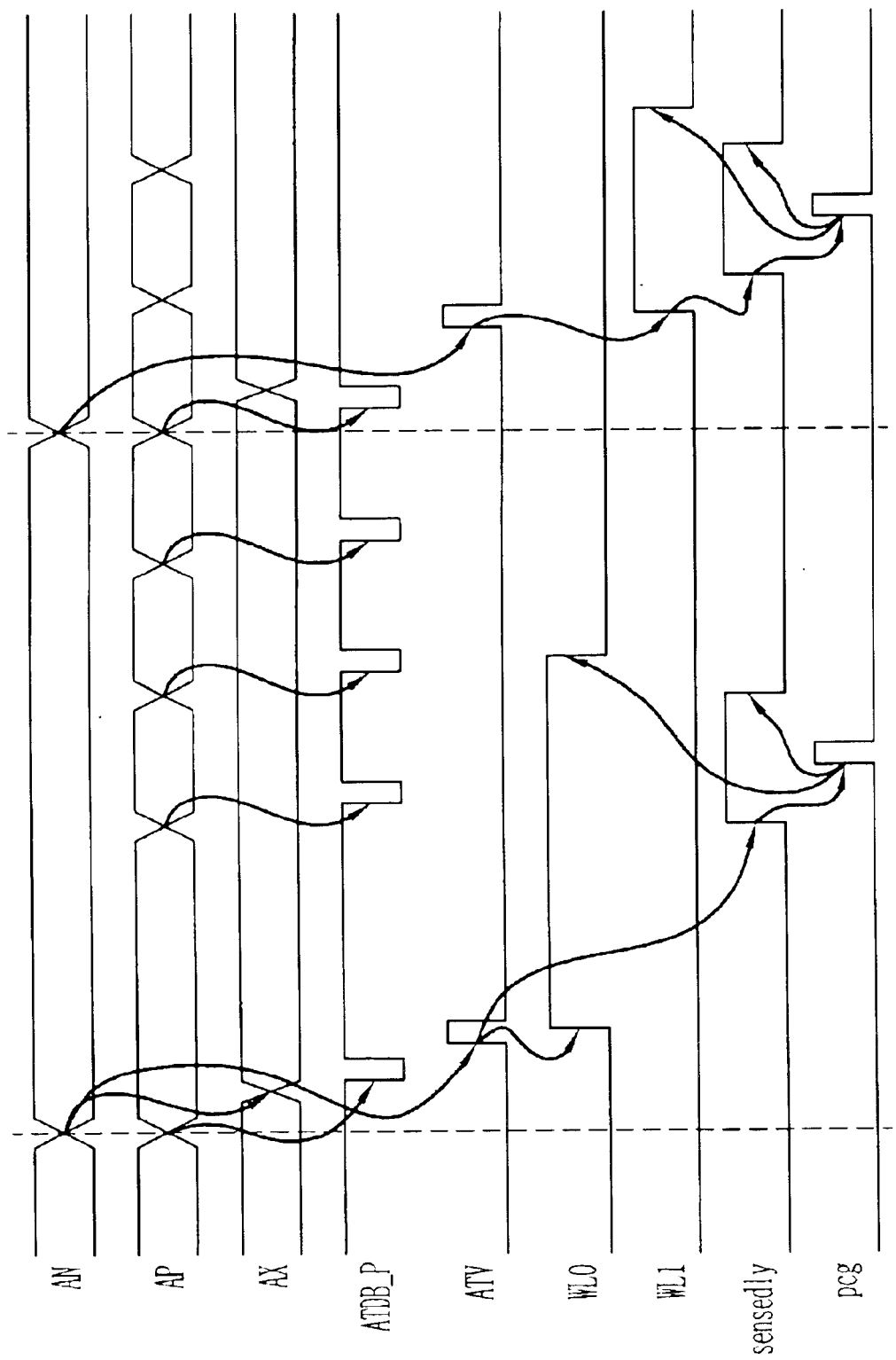
FIG. 14 shows a control waveform of the circuit according to the second embodiment of the present invention.

The operation of the circuit according to the second embodiment of the present invention will be described in detail with reference to FIGS. 9, 12, 13 and 14. FIG. 14 shows a control waveform of the circuit according to the second embodiment of the present invention.

If the external address (AN) inputted to the address buffer 400 is changed, the internal address signal (AX) is changed and the row active signal (ATV) is generated as a pulse. If the page address (AP) is also changed, the address transition detector signal (ATDB_P) is changed. The address transition detector signal (ATDB_P) is a pulse that is internally generated by detecting the transition of the address inputted from the chip, which is a signal that allows the internal circuits to be synchronized to the pulse for high-speed operation of the chip. The NAND device NAND1 performs a NAND operation for the sense delay signal (sensedly) and the signal, which is inverted via the inverter INV1 and is then delayed by some time via the delay unit 110, to output the precharge control signal (pcg). The precharge control signal (pcg) generated thus makes disabled the sense delay signal (sensedly) and the word line that is already enabled. It is preferred that the generated address transition detector signal (ATDB_P) is generated by application of the page address for a read operation of a second cell node, after the selected word line is activated and the level of the first cell node is read by application of the first page address (AP).

The operation of the circuit will now be described. At the initial stage, if the outputs (BAX(0), BAX(1)) are at a LOW level and the precharge control signal (pcg) is at a LOW level, the node A continues to keep a HIGH level. If the row active signal (ATV) becomes a HIGH level, however, the levels of the word line control signals (BAX(0), BAX(1)), being the respective outputs, are decided depending on the level of the address signal (AX). In other words, if the address signal (AX) is applied as the LOW level, the word line control signal (BAX(0)) becomes a HIGH level and the word line control signal (BAX(1)) keeps the LOW level. Meanwhile, if the precharge control signal (pcg) is changed to the HIGH level, the word line control signal (BAX(0)) is disabled to become the LOW level. A detailed operating principle of the second embodiment is almost same as those of the first embodiment. Detailed description thereof will not be given for clarity of the description. Meanwhile, it is to be understood that a page address of the second or more page address (AP) may be used, if necessary.

In the first embodiment, the delay circuit is used in order to disable the selected word line. In the second embodiment, however, the selected word line is disabled using the page address applied for the read operation in the page mode.

As described above, according to the present invention, when a page mode operation is performed, a first cell is accessed and a data of a cell node is read in a bit line sense amplifier. Next, in a state where a word line is disabled, the data is read in the bit line sense amplifier by making continuously enabled only the bit line sense amplifier. Therefore, the present invention has an effect that it can reduce an access time by making the cell node unchanged even if the voltage of the bit line is changed.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of reading a memory device in a page mode, wherein a single word line is enabled to sense levels of a plurality of cell nodes connected thereto, comprising the steps of:
    (a) inputting a row address for selecting the word line;
    (b) enabling a corresponding word line by the row address, and reading/restoring the level of the cell node connected to the enabled word line; and
    (c) disabling the enabled word line and sequentially enabling bit line sense amplifiers connected to the disabled word line to perform a read operation,
    wherein the disabling of the selected word line is performed after a lapse of a certain time period as much as data of a first cell node can be restored.

2. The method as claimed in claim 1, wherein the disabling of the selected word line is performed using a precharge control signal (pcg).

3. The method as claimed in claim 2, wherein the precharge control signal (pcg) is generated by using a given delay sense signal to generate a pulse.

4. The method as claimed in claim 3, wherein the precharge control signal (pcg) is generated by performing a NAND operation for the given delay sense signal and an address transition detector signal generated by a page address.

5. A row decoder control circuit for controlling a row decoder, which is controlled by an internal address, a row active signal and a precharge control signal, in a page mode wherein a single word line is enabled to sense levels of a plurality of cell nodes connected thereto, comprising a pulse output unit for outputting a given delay sense signal inputted thereto as a pulse and then inputting the pulse as the precharge control signal, wherein, after the word line is enabled by a row address, the precharge control signal is outputted after a lapse of a certain time period as much as the data of a first cell node can be restored, and the enabled word line is then disabled in response to the outputted precharge control signal.

6. The row decoder control circuit as claimed in claim 5, wherein the pulse output unit comprises:

a first inverter for inverting the given delay sense signal;

a delay unit connected to the inverter, for delaying the inverted given delay sense signal;

a NAND device for performing a NAND operation for the given delay sense signal and a signal passed through the delay unit; and a second inverter connected to the output of the NAND device.

7. A row decoder control circuit for controlling a row decoder, which is controlled by an internal address, a row active signal and a precharge control signal, in a page mode wherein a single word line is enabled to sense levels of a plurality of cell nodes connected thereto, comprising a pulse output unit for performing a NAND operation for a given delay sense signal and an address transition detector signal of a page address to output the signals as pulses, and inputting the pulses as a precharge control signal, wherein the address transition detector signal is generated by a page address for reading at least second cell node within the same row address, and the enable word line is disabled in response to the output precharge control signal.

* * * * *